United States Patent [19]
Azzouni

[11] Patent Number: 4,870,702
[45] Date of Patent: Sep. 26, 1989

[54] ADJUSTABLE PORTABLE CONSOLE SLEEVE FOR RADIOS

[76] Inventor: Ghassan Azzouni, 48-50 37th St., Long Island City, N.Y. 11101

[21] Appl. No.: 248,980

[22] Filed: Sep. 26, 1988

[51] Int. Cl.⁴ .................... H04B 1/08; H05K 11/02
[52] U.S. Cl. .................................. 455/346; 455/345; 455/347; 455/348; 361/422; 361/391; 312/7.1
[58] Field of Search ............... 455/346, 345, 348, 349, 455/347, 344, 343, 351, 90; 381/86; 361/391, 422; 108/44; 312/7.1

[56] References Cited

U.S. PATENT DOCUMENTS 4,501,013  2/1985  Sato .................................. 381/86

FOREIGN PATENT DOCUMENTS 1148609  5/1963  Fed. Rep. of Germany ...... 455/346

Primary Examiner—Robert L. Griffin
Assistant Examiner—Frederick R. Jorgenson
Attorney, Agent, or Firm—Collard, Roe & Galgano

[57] ABSTRACT

An adjustable, portable console sleeve for radios, for receiving and operating an automobile radio tuner. The console sleeve has a generally rectangular housing with a rectangular opening formed along one side for receiving and enclosing the radio tuner. At least one speaker is mounted within the generally rectangular housing, as well as a one battery and an antenna. A plurality of connectors are disposed within the rectangular opening of the housing, and coupled to the speakers, battery, and antenna. The connectors are aligned with the connectors of the automobile radio tuner and are mounted on a movable connector wall. The movable connector wall has its ends mounted to the side walls defining the opening of said housing and can be adjusted to accommodate the tuner.

7 Claims, 2 Drawing Sheets

ADJUSTABLE PORTABLE CONSOLE SLEEVE FOR RADIOS

BACKGROUND OF THE INVENTION

This invention relates to a radio sleeve box which is capable of receiving an automobile or portable radio and allowing the radio to play independent of the automobile by providing speakers and battery power.

In many of the higher priced automobiles, the expensive car radios are fitted into Bengi boxes that permit the radio to be easily removed when the owner leaves the car. The owners usually take the radios with them or store them in the trunk of the car in order to prevent theft. The expensive radio cannot be played independently once it has been removed from its sleeve holder in the car and disconnected from its power source and speakers.

Accordingly, the present invention provides an auxilliary sleeve which has been prewired with a battery and speakers so that the expensive radio tuner can be plugged into the sleeve and carried as a portable radio to a picnic or to the beach. In the invention, the sleeve is provided with an opening to receive the car radio and also contains speakers mounted on each side of the car radio tuner. The inventive sleeve is also provided with a battery such as a rechargeable battery in order to power the car radio. The inventive sleeve also contains suitable connectors which are designed to match the connectors at the back of the car radio tuner so that the tuner, when slid into the opening of the inventive sleeve, will automatically be connected to the speakers, the battery, and an internal antenna that is provided.

THE PRIOR ART

The patent to Hypolite, U.S. Pat. No. 4,100,372 provides an audio console system for use both in a car or in a home by providing a separate home mounting base which accepts the radio along the side for playing the car radio independent of the vehicle. This unit, however, does not consist of a sleeve but a bulky upright mounting base which is not portable. The patent to Silverstein, U.S. Pat. No. 4,090,033 provides a portable public address system for use on a motor bus that can be removed from a bus by the addition of a portable speaker case connected to the public address system. These prior art devices, however, do not provide a convenient portable carrying case for allowing the radio tuner of the automobile to be easily slipped in, and be automatically connected so that the radio can be quickly transported to a remote location and used It is, therefore, an object according to the present invention to provide a portable sleeve containing speakers, battery, and an antenna to permit a car radio to be used at a remote location.

It is another object according to the present invention to provide a radio sleeve for receiving a car radio tuner which is simple in design, easy to manufacture and reliable in operation.

Other objects and features of the present invention will become readily apparent from the following detailed description considered in connection with the accompanying drawings which disclose an embodiment to the invention.

In the drawings, wherein similar reference characters denote similar elements throughout the several views:

DETAILED DESCRIPTION OF THE INVENTION

Figure 1:
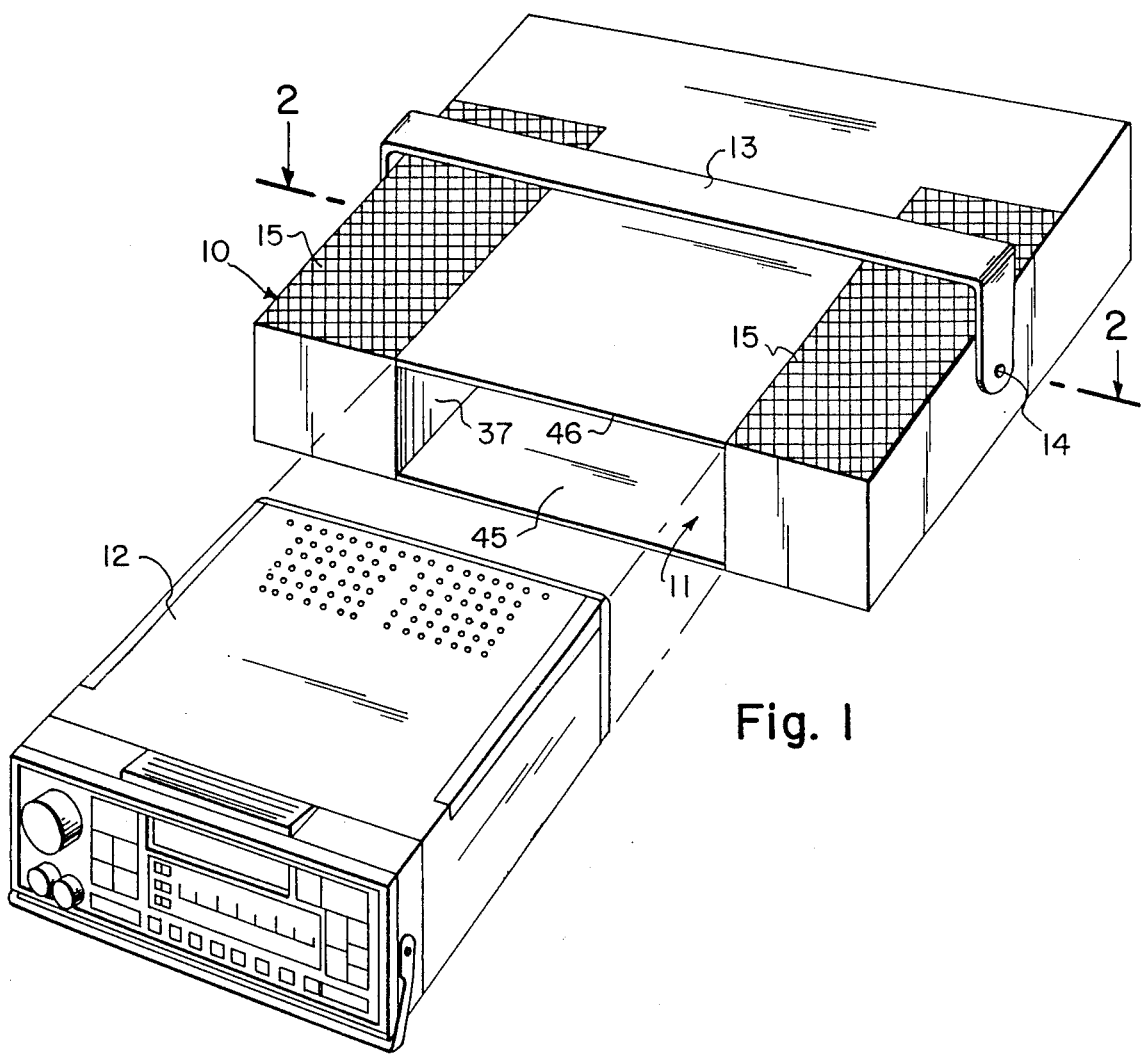
Figure 3:
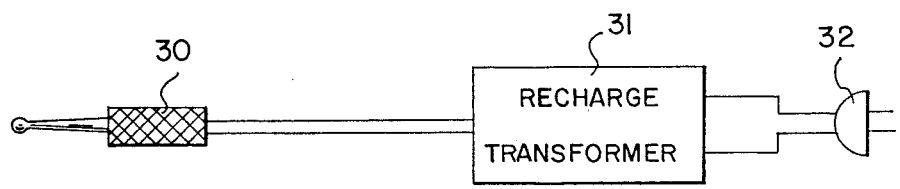
Figure 2:
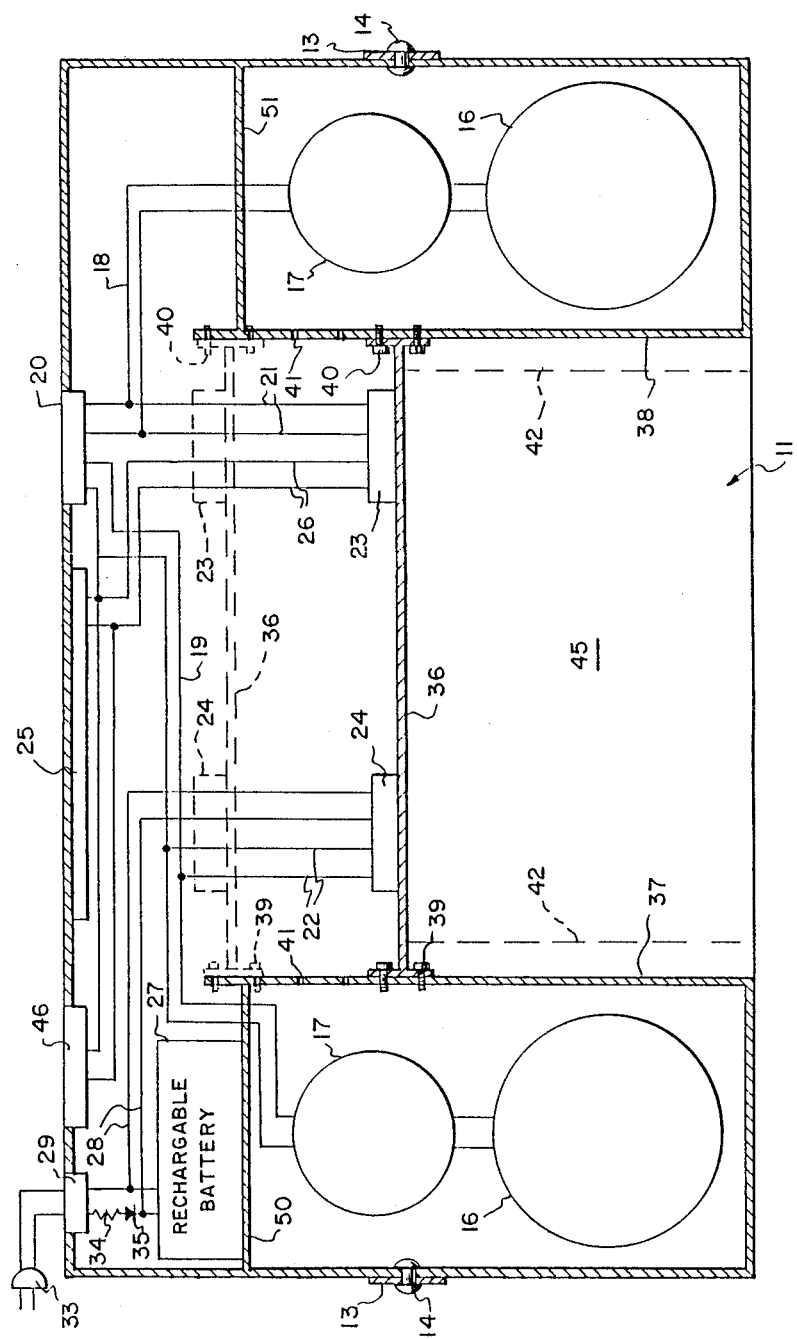

Referring to FIGS. 1-3, there is shown the inventive sleeve box 10 of generally rectangular configuration having a rectangular central opening 11 for receiving a car radio tuner 12 into the opening 11. A carrying handle 13 may also be provided, connected by means of screws 14 to the side of box 10. On each side of opening 11 is provided speaker grills 15.

Underneath each of the speaker grills are speakers 16 and 17 which are connected through cables 18 to an external speaker jack 20. Moreover, each of the speakers are also coupled through cables 21 and 22 to connectors 23 and 24 so that they can be connected to corresponding connectors mounted on the back of radio 12. Sleeve box 10 also includes an internal antenna 25 which is connected by means of cables 26 to connector 23. A rechargeable battery 27 also provides power through cables 28 to connector 24 and an external jack 29 which can receive rechargeable jack 30 connected to rechargeable transformer 31 as shown in detail in FIG. 3. A plug 32 can provide AC power to rechargeable transformer 31 so that the unit can be operated without the battery or be used to recharge battery 27. Inventive sleeve 10 may also contain its own external plug 33 connected by means of a resistor 34 and diode 35 to the rechargeable battery.

Each of connectors 23 and 24 mounted on a movable connector wall 36 which is removeably coupled by screws 39 and 40 to sidewalls 37 and 38 so that connector wall 36 can be adjusted depending upon the length of tuner radio 12. Sidewalls 37 and 38 are provided with additional mounting holes 41 to allow movable connector wall 36 to be positioned in accordance with the length of radio 12. For longer radios, connector wall 36 would be moved to the extreme back end of walls 37 and 38 as shown in dotted line in FIG. 2. In a similar manner, connectors 23 and 24 can also be moved on movable connector wall 36 in order to accommodate and correspond with the location of the power and speaker connectors mounted on the back of radio tuner 12. Inventive sleeve 10 is also provided with styrofoam inserts 42 which can be cemented in place against walls 37 and 38 in order to accommodate the width of radio tuner 12, if necessary.

The inventive sleeve box is designed to be sold as a kit primarily to the after market automobile business, together with different connectors 23 and 24 to match different brands of radios that can be removed from cars. In addition, styrofoam inserts such as inserts 42 will be provided not only for sidewalls 37 and 38 but also for the top and bottom walls 45 and 46 so that the body of radio tuner 12 will be slideably received in opening 11 without any play or vibration.

In the kit provided, opening 11 will be designed slightly larger than the largest of the removable radio tuners that are manufactured so that sleeve 10 can be adapted by the user to accommodate most radios that are available. Sleeve unit 10 is preferably constructed of light weight material such as aluminum so that it does not significantly add to the weight of radio tuner 12. Battery 27 is preferably a rechargeable 12-volt battery but any not non-rechargeable battery could also be used. Unit 10 can be provided with its own recharging circuit or a separate rechargeable circuit as shown in FIG. 3. Speaker 16 and 17 which form the left and right speakers of the stereo system are preferably high quality speakers similar to those contained in the expensive car. Internal antenna 25 is preferably a Ferrite portable antenna, but an external antenna can be connected to antenna jack 46 if necessary.

Unit 10 is preferably constructed of a rectangular box having compartments to contain and house stereo speakers 16 and 17. Each of the speakers are closed in by means of walls 37 and 38, 50 and 51, and the external walls of the sleeve unit. The battery and the electrical connections are preferably contained at the back of sleeve unit 10 in a compartment defined by walls 50, 36, 51 and the back and side walls of the unit.

While only a few embodiments to the present invention have been shown and described, it will be obvious that many changes and modifications may be made thereunto without departing from the spirit and scope of the invention.

What is claimed is:

1. A sleeve carrying unit for receiving and operating a removable automobile radio tuner having external electrical connectors for the antenna battery, and speakers mounted on the back wall of the radio, comprising:
    a generally rectangular housing having a rectangular opening formed along one side for receiving and enclosing the removable radio tuner said opening having opposed side walls and top and bottom walls,
    at least one speaker mounted within said generally rectangular housing:
    at least one battery mounted within said housing;
    at least one antenna mounted within said housing;
    connector means disposed within said housing within said rectangular opening and coupled to said at least one speaker, said at least one battery, and said at least one antenna, said connector means being correspondingly aligned with the connectors of said removable automobile radio tuner,
    a movable connector wall for receiving and supporting said electrical connector means, said movable connector wall having its ends mounted to the opposed side walls defining the opening of said housing, and removable fastening means for permitting said movable connector wall to be adjustably mounted on said side walls to accommodate the length of the radio tuner, and permit alignment of said connector means with the connectors on the back wall of said radio tuner.

2. The sleeve unit as recited in claim 1 wherein said speaker means comprises stereo speakers disposed in said housing on opposite sides of said radio receiving opening.

3. The sleeve unit as recited in claim 2, wherein said stereo speakers include an external speaker jack coupled thereto.

4. The sleeve unit as recited in claim 3, wherein said antenna includes an external antenna jack coupled thereto.

5. The sleeve unit as recited in claim 4, wherein said battery is a rechargeable battery, and charging means coupled to said rechargeable battery for recharging the battery from an external AC power source.

6. The sleeve unit as recited in claim 5, wherein said external charging surface comprises a rechargeable transformer for connection to an AC power source, and a rechargeable jack coupled to the output of said transformer for insertion into said housing and connection to said rechargeable battery.

7. The sleeve unit as recited in claim 6, additionally comprising inserts for coupling to the walls of said radio receiving opening for narrowing the width of said walls to accommodate the width of the radio tuner.

* * * * *

UNITED STATES PATENT OFFICE
CERTIFICATE OF CORRECTION

Patent No. 4,870,702　　　　　　　　　Dated September 26, 1989

Inventor(s) Ghassan Hassan AZZOUNI

It is certified that error appears in the above-identified patent and that said Letters Patent is hereby corrected as shown below:

Cover page, column 1, item [76], line 2, after "Ghassan" insert --Hassan--.

Signed and Sealed this
Twenty-fifth Day of September, 1990

*Attest:*

HARRY F. MANBECK, JR.

*Attesting Officer*　　　*Commissioner of Patents and Trademarks*